(12) United States Patent
Lee

(10) Patent No.: US 9,894,745 B2
(45) Date of Patent: *Feb. 13, 2018

(54) ANTENNA STRUCTURE AND PLASMA GENERATING DEVICE

(71) Applicant: Semes Co., Ltd., Cheonan-si, Chungcheongnam-do (KR)

(72) Inventor: YongKwan Lee, Daejeon (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/010,338

(22) Filed: Jan. 29, 2016

(65) Prior Publication Data

US 2016/0150628 A1 May 26, 2016

Related U.S. Application Data

(62) Division of application No. 13/990,840, filed as application No. PCT/KR2011/006887 on Sep. 16, 2011, now Pat. No. 9,282,624.

(51) Int. Cl.
*H01J 7/24* (2006.01)
*H05H 1/46* (2006.01)
*H01J 37/32* (2006.01)

(52) U.S. Cl.
CPC ............ *H05H 1/46* (2013.01); *H01J 37/3211* (2013.01); *H01J 2237/327* (2013.01); *H05H 2001/4667* (2013.01)

(58) Field of Classification Search
CPC .......... H01J 25/12; H01J 23/083; H01J 3/029; H01J 25/20; H01J 23/02; H01Q 7/08;
(Continued)

(56) References Cited

U.S. PATENT DOCUMENTS

| 8,712,323 B2 | 4/2014 | Pahlavan et al. |
| 9,282,624 B2 * | 3/2016 | Lee ....................... H01J 37/3211 |
| 9,642,238 B2 * | 5/2017 | Lee ........................... H05H 1/46 |

FOREIGN PATENT DOCUMENTS

| CN | 1423827 A | 6/2003 |
| CN | 1481207 A | 3/2004 |

(Continued)

OTHER PUBLICATIONS

International Search Report PCT/ISA/210 for PCT/KR2011/006887 dated Feb. 15, 2012.

*Primary Examiner* — Minh D A
(74) *Attorney, Agent, or Firm* — Harness, Dickey & Pierce, P.L.C.

(57) ABSTRACT

An antenna structure includes four induction antennas which have the same structure, are connected in parallel and are disposed to be overlapped. The induction antennas include an external upper section arranged on a first quadrant of a first layer, an internal upper section connected to the external upper section and arranged on a second quadrant of the first layer, an internal lower section connected to the internal upper section and arranged on a third quadrant of a second layer arranged on a lower part of the first layer, and an external lower section connected to the internal lower section and arranged on a fourth quadrant of the second layer. An RF power is supplied to one end of the external upper section, and the other end of the external lower section is grounded.

2 Claims, 9 Drawing Sheets

(58) Field of Classification Search
CPC .. H01Q 1/38; H01Q 3/44; H01Q 9/42; H01Q 1/40; H01Q 7/06; H01Q 1/273; H01Q 7/00
See application file for complete search history.

(56) References Cited

FOREIGN PATENT DOCUMENTS

| | | |
|---|---|---|
| CN | 1537405 A | 10/2004 |
| CN | 101543141 A | 9/2009 |
| JP | H08-195296 A | 7/1996 |
| KR | 2007-0033222 A | 3/2007 |
| KR | 100692420 B1 | 3/2007 |
| KR | 2008-0107758 A | 12/2008 |
| KR | 2009-0027479 A | 3/2009 |
| KR | 2009-0102257 A | 9/2009 |
| KR | 2011-0114118 A | 10/2011 |

\* cited by examiner

ANTENNA STRUCTURE AND PLASMA GENERATING DEVICE

CROSS REFERENCE TO RELATED APPLICATIONS

This is a divisional of U.S. application Ser. No. 13/990,840, filed on May 31, 2013, with a 371(c) date of Jul. 2, 2013, which is a National Phase of PCT/KR2011/006887, filed Sep. 16, 2011, the entire contents of each of which are hereby incorporated by reference.

TECHNICAL FIELD

The inventive concepts described herein relate to a plasma generating device, and more particularly, relate to an antenna structure capable of generating inductive coupling plasma

Background Art

Large-scaled substrates such as a semiconductor substrate, a flat panel display substrate, a solar cell substrate, etc. may necessitate large-scaled fabricating devices for treating them. A plasma treatment device may be used for various processes such as etching, deposition, ion implantation, material surface treatment, etc.

DISCLOSURE

Technical Problem

The present invention provides an antenna structure capable of forming plasma uniformly.

The present invention also provides a plasma generating device capable of forming plasma uniformly.

Technical Solution

The antenna structure includes four induction antennas which have the same structure, are connected in parallel and are disposed to be overlapped. The induction antennas include an external upper section disposed on a first quadrant of a first layer, an internal upper section connected to the external upper section and disposed on a second quadrant of the first layer, an internal lower section connected to the internal upper section and disposed on a third quadrant of a second layer disposed on a lower part of the first layer, and an external lower section connected to the internal lower section and disposed on a fourth quadrant of the second layer. An RF power is supplied to one end of the external upper section, and the other end of the external lower section is grounded.

Advantageous Effects

With an embodiment of the present invention, an antenna structure provides inductive coupling plasma stably and uniformly.

MODE FOR INVENTION

A large-scaled plasma treatment device has to secure high plasma density, uniformity of plasma density, and process repeatability. Inductive coupling plasma may obtain high plasma. However, it is difficult to secure uniformity of plasma.

The present invention will now be described in detail with reference to the accompanying drawings, in which preferred embodiments of the invention are shown. However, the inventive concept is not limited thereto. Rather, embodiments introduced here may be provided such that disclosed contents become thorough and perfect and the spirit of the present invention is sufficiently provided to one skilled in the art. In figures, thickness of layers (or, films) and areas may be exaggeratedly illustrated. Also, in a case where a layer (or, film) is described to be put "on" another layer (or, film) or a substrate, a layer (or, film) may be directly put on another layer (or, film) or a substrate or on another layer (or, film) or a substrate with a third layer (or, film) interposed therebetween. Portions marked by the same reference numbers over the specification may indicate the same constituent elements.

Figure 1A:
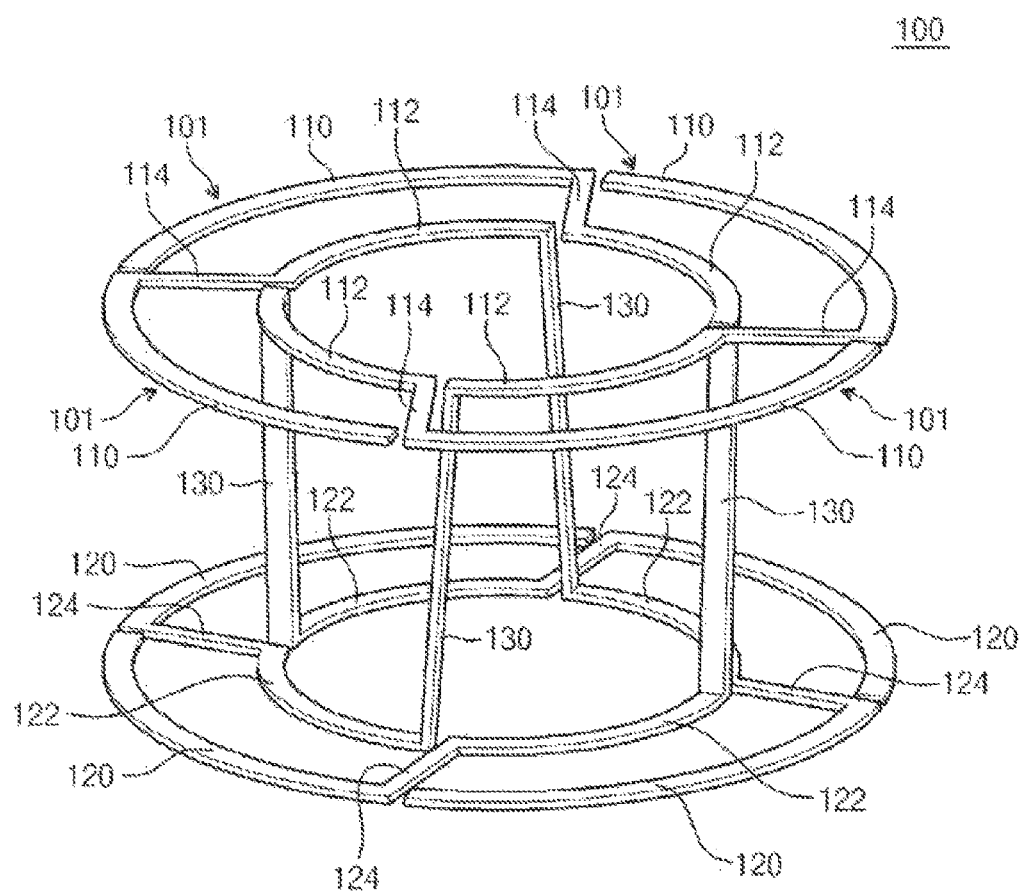
FIG. 1A is a diagram schematically illustrating an antenna structure according to an embodiment of the present invention.

FIG. 1A is a diagram schematically illustrating an antenna structure according to an embodiment of the present invention.

Figure 1B:
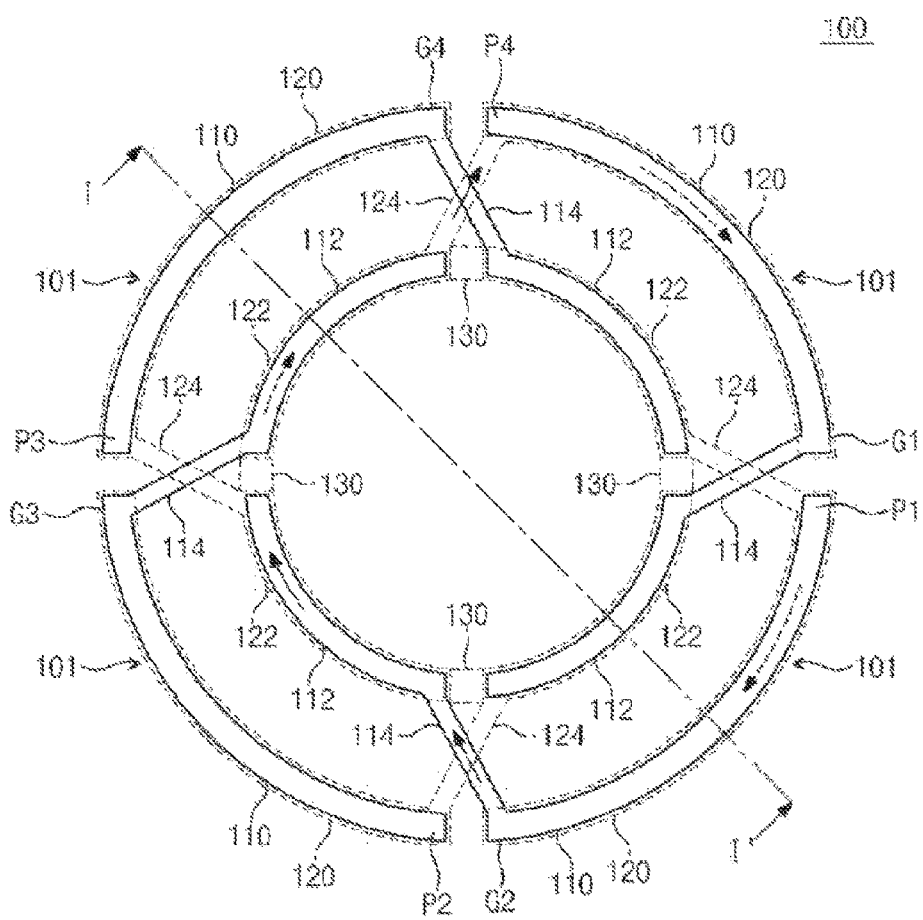
FIG. 1B is a plan view of an antenna structure of FIG. 1A.

FIG. 1B is a plan view of an antenna structure of FIG. 1A.

Figure 1C:
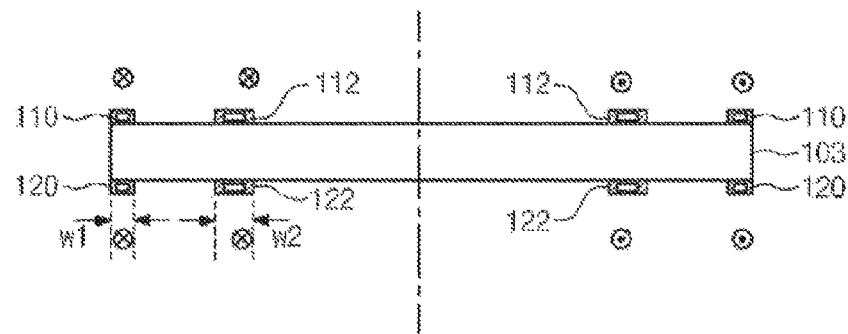
FIG. 1C is a cross-sectional view taken along a line I-I' of FIG. 1B.

FIG. 1C is a cross-sectional view taken along a line I-I' of FIG. 1B.

Referring to FIGS. 1A to 1C, the antenna structure 100 may include four induction antennas 101 which have the same structure, are connected in parallel with one another, and are disposed to be overlapped. Each of the induction antennas 101 may include an external upper section 110 disposed on a first quadrant of a first layer; an internal upper section 112 connected to the external upper section 110 and disposed on a second quadrant of the first layer; an internal lower section 122 connected to the internal upper section 112 and disposed on a third quadrant of a second layer disposed at a lower part of the first layer; and an external lower section 120 connected to the internal lower section 122 and disposed on a fourth quadrant of the second layer.

One ends P1, P2, P3, and P4 of the external upper sections 110 may be supplied with an RF power, and the other ends G1, G2, G3, and G4 of the external lower sections 120 may be grounded. The induction antennas 101 may be rotated by 90 degrees with respect to a central axis to be overlapped with one another.

In the antenna structure 100 according to an embodiment of the present invention, four induction antennas 101 may be electrically connected in parallel with one another. This may allow the antenna structure 100 to have low impedance, so that a high current is applied. Also, each of the induction antennas 101 may be interconnected without disconnection to form a loop. In this case, the induction antennas 101 may substantially form a closed loop to generate a maximal inducted electromotive force. A symmetrical shape of the antenna structure 100 may enable a symmetrical property of plasma in a rotation direction to be improved. Also, external sections 110 and 120 may form plasma outside, and the internal sections 112 and 122 may form plasma inside. Thus, radial uniformity of plasma may be improved.

The induction antennas 101 may be supplied with the RF power at the first layer and grounded at the second layer. Also, a current may flow through the induction antennas 101 in one direction such as a clockwise direction or counter-clockwise direction. Thus, with the bi-level structure, it is possible to suppress such a phenomenon that a plasma density is locally increased due to capacitive coupling and inductive coupling at a location where the RF power is supplied.

The external upper section 110 may have a first curvature radius, and may be disposed at the first quadrant of the first layer. The external upper section 110 may have a metal or metal alloy strip or pipe shape. Desirably, the external upper section 110 may be formed of silver or gold plated copper. The external upper section 110 may have a thickness ranging from several millimeters to dozens millimeters. Desirably, the external upper section 110 may have a thickness ranging from 10 millimeters to 20 millimeters. The external upper section 110 can have a thickness of about several millimeters. One end of the external upper section 110 may be supplied with the RF power. The external upper sections 110 may be symmetrically disposed to form a peripheral area.

The internal upper section 112 may have a second curvature radius, and may be disposed on the second quadrant at substantially the same plane as the first layer. The internal upper section 112 may be disposed in an area which is formed by the external upper sections 110. The first curvature radius may be more than the second curvature radius. A current may flow into the induction antenna 101 in a clockwise direction. The internal upper sections 112 may be adjacent to the external upper sections, and may be disposed continuously in a rotation direction.

An upper branch 114 may connect the other end of the external upper section 110 and one end of the internal upper section 112. The upper branch 114 may be formed of the same material as that of the external upper section 110. The upper branch 114 and the external upper section 110 may be connected by electric connection means such as bolts and/or welding. The upper branch 114 and the internal upper section 112 may be connected by electric connection means such as bolts and/or welding.

A vertical branch 130 may connect the other end of the internal upper section 112 and one end of the internal lower section 122. The vertical branch 130 may connect the first layer and the second layer.

The internal lower sections 122 may be adjacent to the internal upper sections 112, and may be disposed continuously in a rotation direction.

The internal lower section 122 may be disposed at the second layer disposed under the first layer. The internal lower section 122 may be disposed on the third quadrant. An interval between the first layer and the second layer may be several millimeters to dozens millimeters. Desirably, an interval between the first layer and the second layer may be 10 millimeters to 15 millimeters. The internal lower section 122 may have the second curvature radius. An insulator 103 may be disposed between the first layer and the second layer.

A lower branch 124 may connect the other end of the internal lower section 122 and one end of the external lower section 120.

The external lower section 120 may be disposed on the fourth quadrant of the second layer. The external lower section 120 may have the first curvature radius. The other end of the external lower section 120 may be grounded.

Widths of the internal lower and upper sections 122 and 112 may be wider than those of the external lower and upper sections 120 and 110. Thus, a plasma generation space formed by the external upper section 110 and the external lower section 120 may be reduced, and a plasma generation space formed by the internal upper section 112 and the internal lower section 122 may be increased. This may mean that plasma uniformity in a radial direction increases.

To form large area plasma according to a large scaled plasma generating device, the RF power supplied to the antenna structure may run to nearly several KW to dozens KW. Also, divice's simplicity may be required. In recent years, to form large area plasma according to a large scaled plasma generating device, the RF power supplied to the antenna structure may run to nearly several KW to dozens KW. Thus, cooling may be required for thermal stability of the antenna structure 100. Also, device's simplicity may be required. Thus, the induction antennas 101 may have a pipe shape, and may be cooled by refrigerant such as air or fluid. The refrigerant may flow through insides of the induction antennas 101.

Figure 2A:
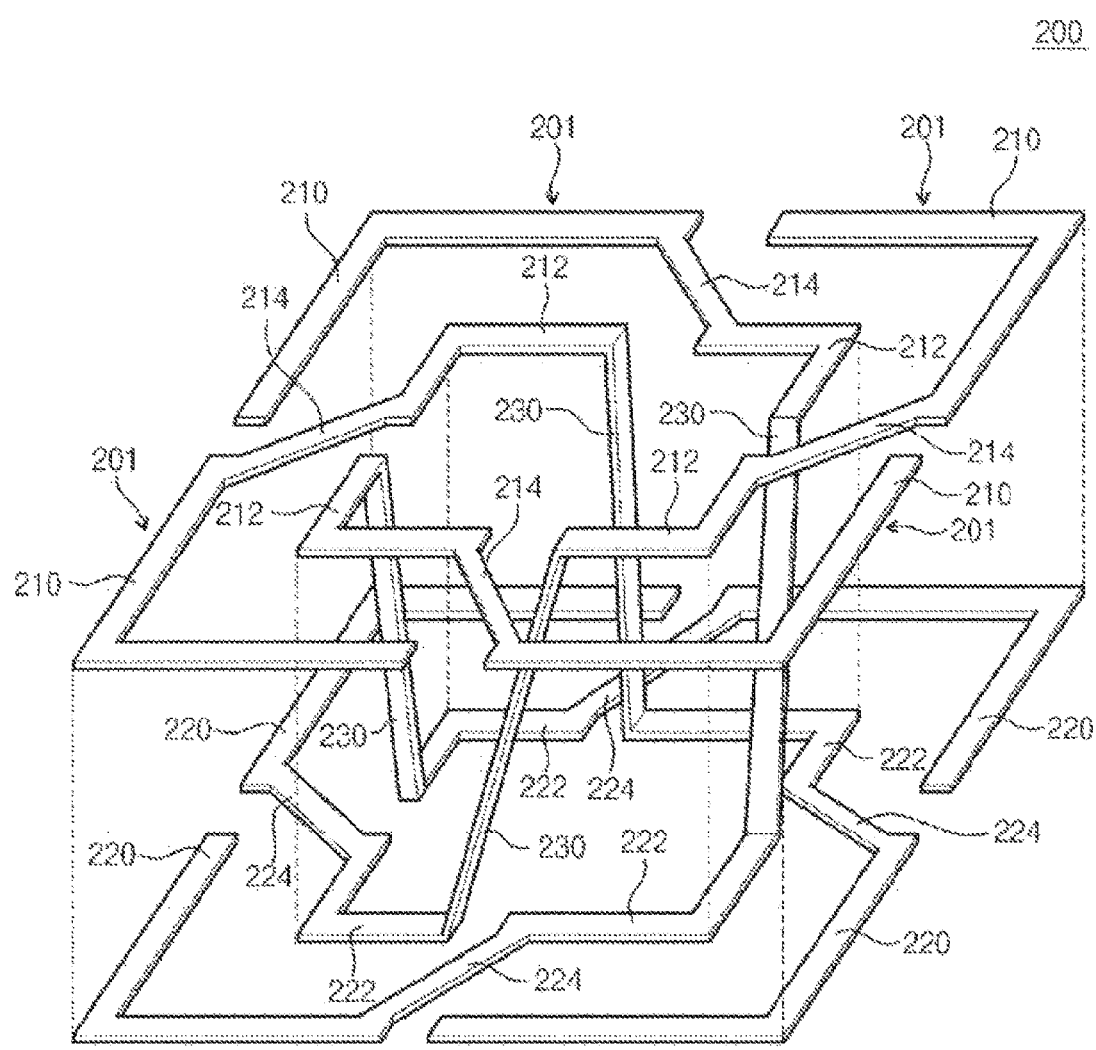
FIG. 2A is a diagram schematically illustrating an antenna structure according to another embodiment of the present invention.

FIG. 2A is a diagram schematically illustrating an antenna structure according to another embodiment of the present invention.

Figure 2B:
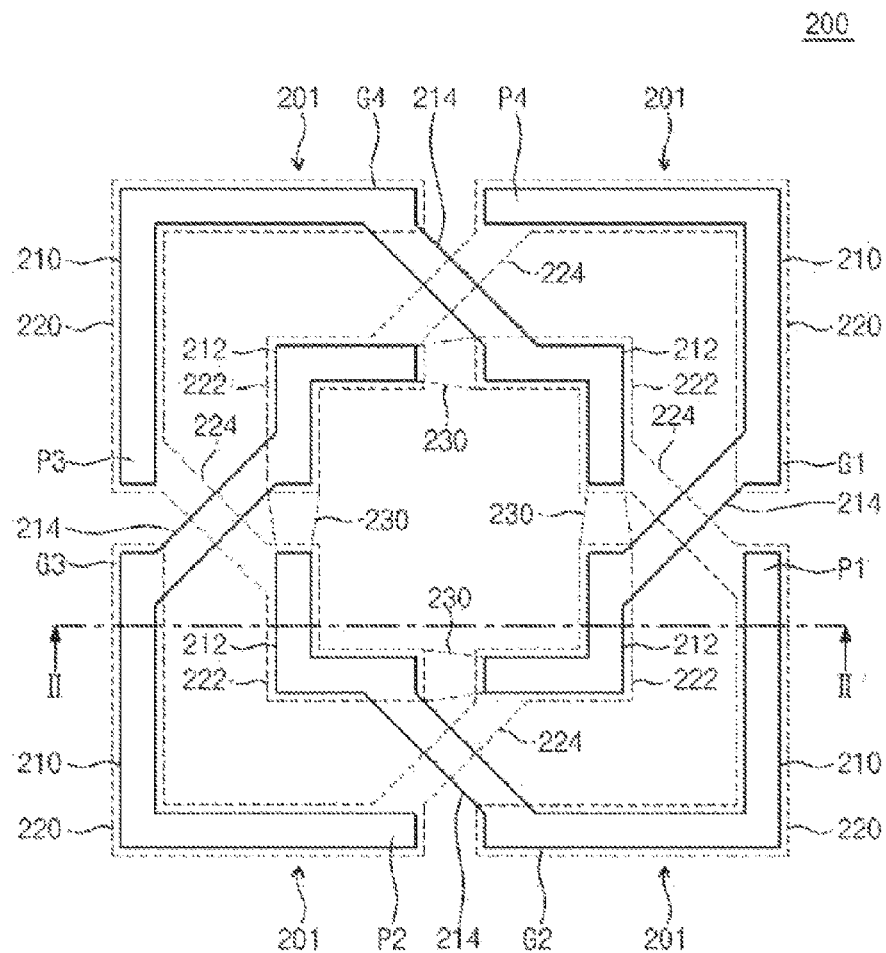
FIG. 2B is a plan view of an antenna structure of FIG. 2A.

FIG. 2B is a plan view of an antenna structure of FIG. 2A.

Figure 2C:
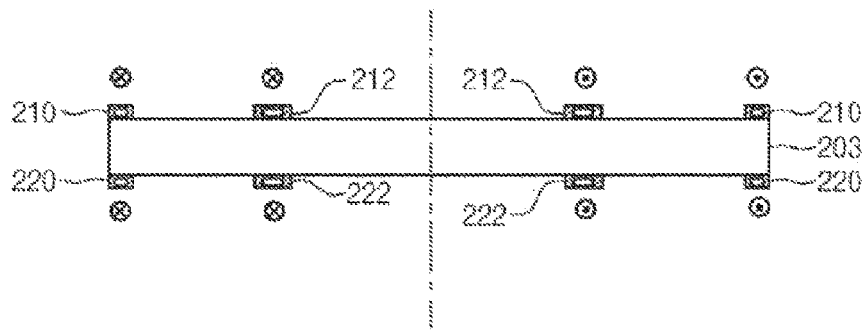
FIG. 2C is a cross-sectional view taken along a line II-II' of FIG. 2B.

FIG. 2C is a cross-sectional view taken along a line II-II' of FIG. 2B.

Referring to FIGS. 2A to 2C, the antenna structure 200 may include four induction antennas 201 which have the same structure, are connected in parallel with one another, and are disposed to be overlapped. Each of the induction antennas 201 may include an external upper section 210 disposed on a first quadrant of a first layer; an internal upper section 212 connected to the external upper section 210 and disposed on a second quadrant of the first layer; an internal lower section 222 connected to the internal upper section 212 and disposed on a third quadrant of a second layer disposed at a lower part of the first layer; and an external lower section 220 connected to the internal lower section 222 and disposed on a fourth quadrant of the second layer. One ends P1, P2, P3, and P4 of the external upper sections 210 may be supplied with an RF power, and the other ends G1, G2, G3, and G4 of the external lower sections 220 may be grounded. The induction antennas 201 may be rotated by 90 degrees with respect to a central axis to be overlapped with one another.

In the antenna structure 200 according to an embodiment of the present invention, four induction antennas 201 may be electrically connected in parallel with one another. This may allow the antenna structure 200 to have low impedance, so that a high current is applied. Also, each of the induction antennas 201 may be interconnected without disconnection to form a loop. In this case, the induction antennas 201 may substantially form a closed loop to generate a maximal inducted electromotive force. A symmetrical shape of the antenna structure 200 may enable a symmetrical property of plasma in a rotation direction to be improved. Also, the external sections 210 and 220 may form plasma outside, and the internal sections 212 and 222 may form plasma inside. Thus, radial uniformity of plasma may be improved.

The induction antennas 201 may be supplied with the RF power at the first layer and grounded at the second layer. Also, a current may flow through the induction antennas 201 in one direction such as a clockwise direction or counter-clockwise direction. Thus, with the bi-level structure, it is possible to suppress such a phenomenon that a plasma density is locally increased due to capacitive coupling and inductive coupling at a location where the RF power is supplied.

The external upper section 210 may be bent at a right angle, and may be disposed on the first quadrant of the first layer. The external upper section 210 may have a metal or metal alloy strip or pipe shape. Desirably, the external upper section 210 may be formed of silver or gold plated copper. The external upper section 210 may have a thickness ranging from several millimeters to dozens millimeters. Desirably, the external upper section 210 may have a thickness ranging from 10 millimeters to 20 millimeters. The external upper section 210 can have a thickness of about several millimeters. One end of the external upper section 210 may be supplied with the RF power. The external upper sections 210 may be symmetrically disposed to form a peripheral area.

The internal upper section 212 may be bent at a right angle, and may be disposed on the second quadrant at substantially the same plane as the first layer. The internal upper section 212 may be disposed in an area which is formed by the external upper sections 210. An area occupied by the internal upper section 212 may be wider than an area occupied by the external upper section 210. A current may flow into the induction antenna 201 in a clockwise direction. The internal upper sections 212 may be adjacent to the external upper sections, and may be disposed continuously in a rotation direction.

An upper branch 214 may connect the other end of the external upper section 210 and one end of the internal upper section 212. The upper branch 214 may be formed of the same material as that of the external upper section 210. The upper branch 214 and the external upper section 210 may be connected by electric connection means such as bolts and/or welding. The upper branch 214 and the internal upper section 212 may be connected by electric connection means such as bolts and/or welding.

A vertical branch 230 may connect the other end of the internal upper section 212 and one end of the internal lower section 222. The vertical branch 230 may connect the first layer and the second layer.

The internal lower sections 222 may be adjacent to the internal upper sections 212, and may be disposed continuously in a rotation direction. The internal lower section 222 may be disposed at the second layer disposed under the first layer. The internal lower section 222 may be disposed on the third quadrant. An interval between the first layer and the second layer may be several millimeters to dozens millimeters. Desirably, an interval between the first layer and the second layer may be 10 millimeters to 15 millimeters. The internal lower section 222 may be bent at a right angle.

A lower branch 224 may connect the other end of the internal lower section 222 and one end of the external lower section 220.

The external lower section 220 may be disposed on the fourth quadrant of the second layer. The external lower section 220 may be bent at a right angle. The other end of the external lower section 220 may be grounded.

Widths of the internal lower and upper sections 222 and 212 may be wider than those of the external lower and upper sections 220 and 210. Thus, a plasma generation space formed by the external upper section 210 and the external lower section 220 may be reduced, and a plasma generation space formed by the internal upper section 212 and the internal lower section 222 may be increased. This may mean that plasma uniformity in a radial direction increases.

Figure 3A:
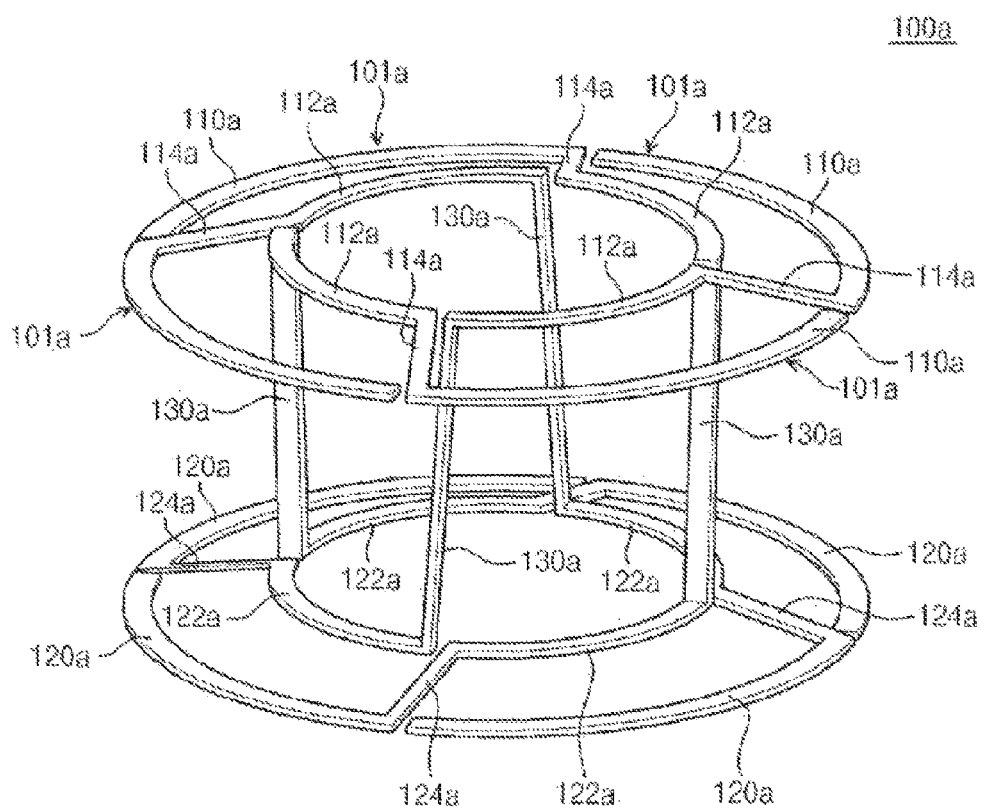
FIG. 3A is a diagram schematically illustrating an antenna structure according to still another embodiment of the present invention.

FIG. 3A is a diagram schematically illustrating an antenna structure according to still another embodiment of the present invention.

Figure 3B:
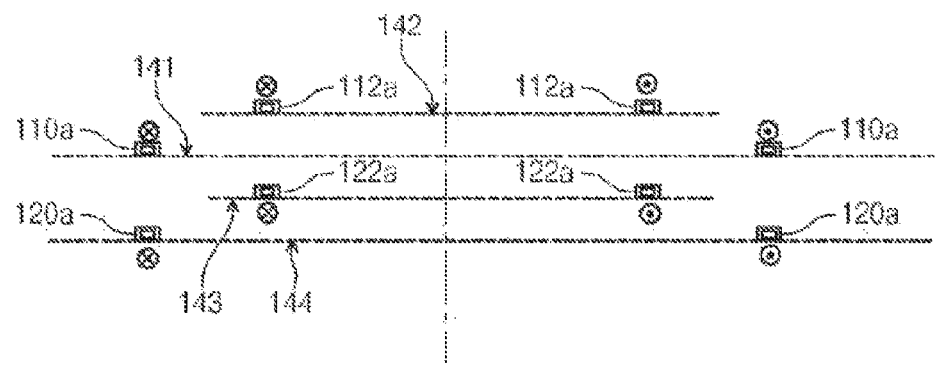
FIG. 3B is a cross-sectional view of an antenna structure of FIG. 3A.

FIG. 3B is a cross-sectional view of an antenna structure of FIG. 3A.

Referring to FIGS. 3A and 3B, the antenna structure 100a may include four induction antennas 101a which have the same structure, are connected in parallel with one another, and are disposed to be overlapped. the induction antennas 101a may include an external upper section 110a disposed on a first quadrant of a first layer 141; an internal upper section 112a connected to the external upper section 110a and disposed on a second quadrant of a second layer 142 disposed at an upper part of the first layer; an internal lower section 122a connected to the internal upper section 112a and disposed on a third quadrant of a third layer 143 disposed at a lower part of the second layer; and an external lower section 120a connected to the internal lower section 112a and disposed on a fourth quadrant of a fourth layer 144 disposed at a lower part of the first layer 141. One end of the external upper section 110a may be supplied with an RF power, and the other end of the external lower section 120a may be grounded.

An upper branch 114a may connect the other end of the external upper section 110a and one end of the internal upper section 112a. A vertical branch 130a may connect the other end of the internal upper section 112a and one end of the internal lower section 122a. A lower branch 124 may connect the other end of the internal lower section 122a and one end of the external lower section 120a.

Figure 4:
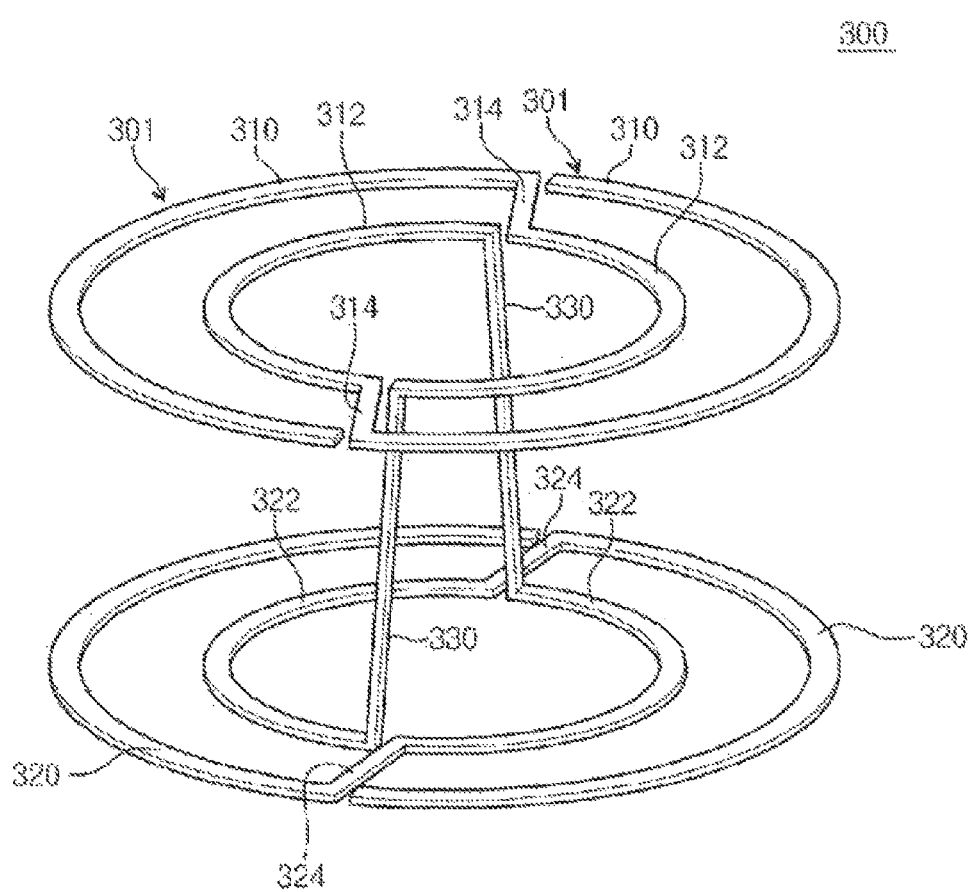
FIG. 4 is a diagram schematically illustrating an antenna structure according to still another embodiment of the present invention.

FIG. 4 is a diagram schematically illustrating an antenna structure according to still another embodiment of the present invention.

Referring to FIG. 4, the antenna structure 300 may include two induction antennas 301 which have the same structure, are connected in parallel with one another, and are disposed to be overlapped. the induction antennas 301 may include an external upper section 310 disposed over a first quadrant and a second quadrant of a first layer; an internal upper section 312 connected to the external upper section 310 and disposed over a third quadrant and a fourth quadrant of the first layer; an internal lower section 322 connected to the internal upper section 312 and disposed over a first quadrant and a second quadrant of a second layer disposed at a lower part of the first layer; and an external lower section 320 connected to the internal lower section 322 and disposed over a third quadrant and a fourth quadrant of the second layer. One end of the external upper section 310 may be supplied with an RF power, and the other end of the external lower section 320 may be grounded.

An upper branch 314 may connect the other end of the external upper section 310 and one end of the internal upper section 312. A vertical branch 330 may connect the other end of the internal upper section 312 and one end of the internal lower section 322. A lower branch 324 may connect the other end of the internal lower section 322 and one end of the external lower section 320.

Figure 5:
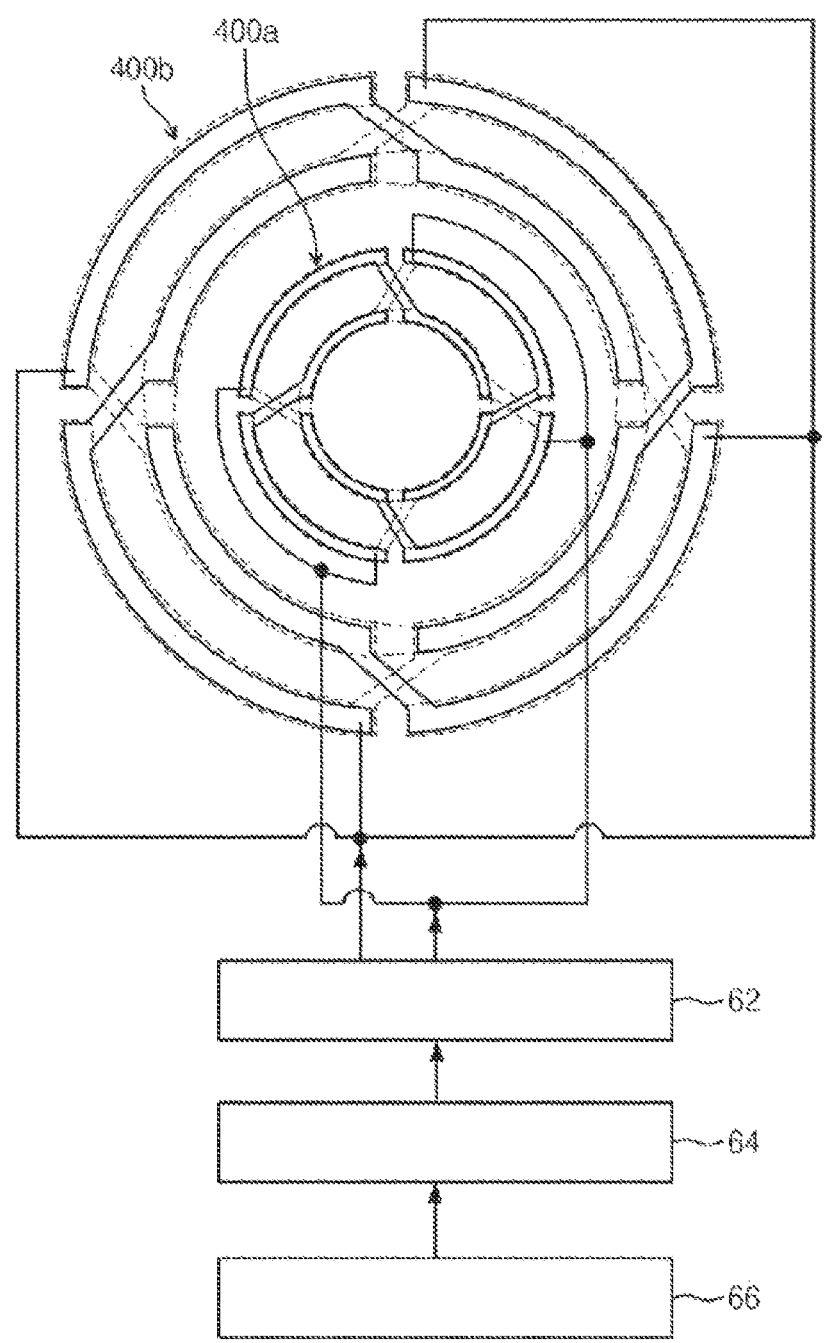
FIG. 5 is a diagram schematically illustrating a plasma generating device according to an embodiment of the present invention.

FIG. 5 is a diagram schematically illustrating a plasma generating device according to an embodiment of the present invention.

Figure 6:
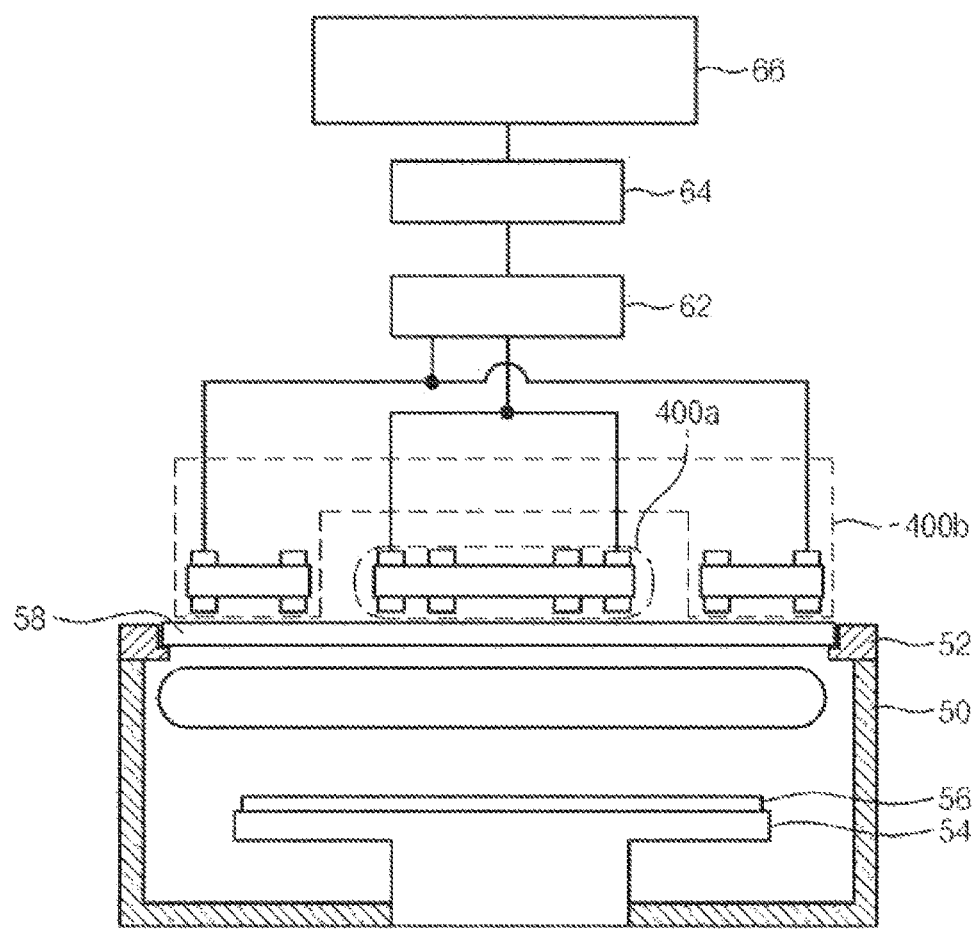
FIG. 6 is a cross-sectional view of a plasma generating device of FIG. 5.

FIG. 6 is a cross-sectional view of a plasma generating device of FIG. 5. Referring to FIGS. 5 and 6, a plasma generating device may include a vacuum container 50, a dielectric unit 58 disposed at a part of the vacuum container 50, and an antenna structure for plasma generation 400a and 400b disposed on the dielectric unit 58. The antenna structure 400a and 400b may include a first antenna structure 400a and a second antenna structure 400b. The first antenna structure 400a may be disposed in the second antenna structure 400b.

The first antenna structure 400a and the second antenna structure 400b may be connected to a power distribution unit 62. The power distribution unit 62 may distribute a power to the first antenna structure 400a and the second antenna structure 400b. The power distribution unit 62 may be formed of passive elements such as inductors, capacitors, and so on.

An RF power 66 may supply a power to the antenna structure 400a and 400b through an impedance matching network 64 and the power distribution unit 62. The first antenna structure 400a and the second antenna structure 400b may be electrically connected in parallel. The antenna structure may include four induction antennas which have the same structure, are connected in parallel with one another, and are disposed to be overlapped. Each of the induction antennas may include an external upper section disposed on a first quadrant of a first layer; an internal upper section connected to the external upper section and disposed on a second quadrant of the first layer; an internal lower section connected to the internal upper section and disposed on a third quadrant of a second layer disposed at a lower part of the first layer; and an external lower section connected to the internal lower section and disposed on a fourth quadrant of the second layer. One end of the external upper section may be supplied with an RF power, and the other end of the external lower section may be grounded.

Figure 7:
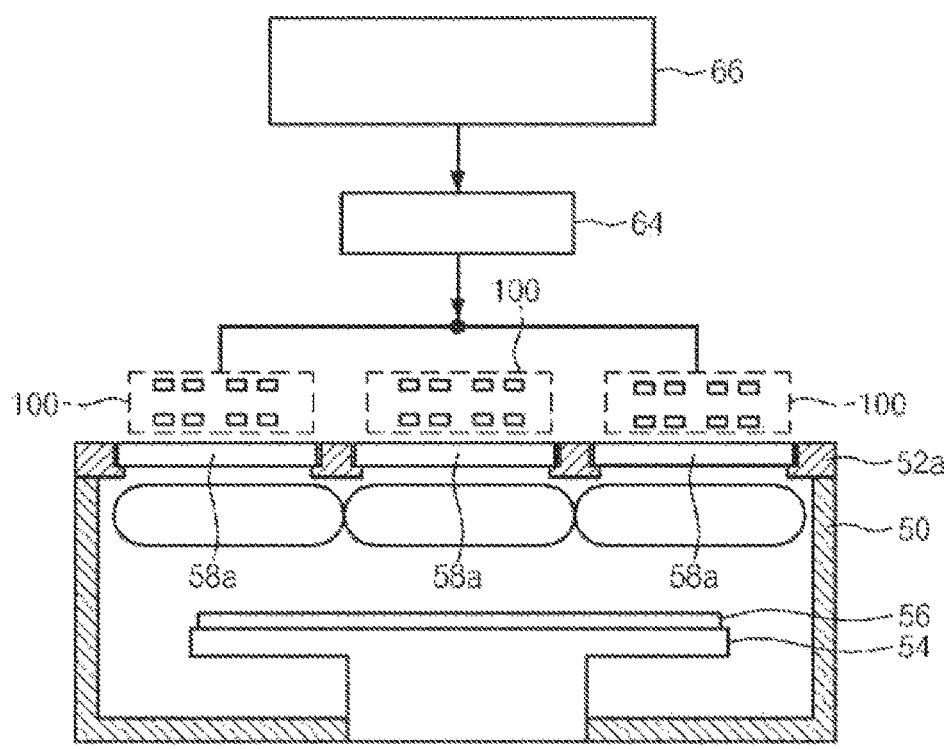
FIG. 7 is a diagram schematically illustrating a plasma generating device according to another embodiment of the present invention.

FIG. 7 is a diagram schematically illustrating a plasma generating device according to another embodiment of the present invention.

Referring to FIG. 7, the plasma generating device may include a vacuum container 50, a dielectric unit 58a disposed at a part of the vacuum container 50, and an antenna structure for plasma generation 100 disposed on the dielectric unit 58a.

The dielectric unit 58a may include a plurality of dielectric portions spaced apart from one another. The antenna structure 100 may include a plurality of antenna structures spaced apart from one another. The antenna structures may be put on corresponding dielectric portions, respectively.

With a modified embodiment of the present invention, the antenna structure may be changed with an antenna structure described with reference to FIGS. 1 to 4.

The invention claimed is:

1. An antenna structure for plasma generation, comprising:
   two induction antennas which have the same structure, are connected in parallel with one another, and are disposed to be overlapped,
   wherein the induction antennas comprises:
   an external upper section disposed over a first quadrant and a second quadrant of a first layer;
   an internal upper section connected to the external upper section and disposed over a third quadrant and a fourth quadrant of the first layer;
   an internal lower section connected to the internal upper section and disposed over a first quadrant and a second quadrant of a second layer disposed at a lower part of the first layer; and
   an external lower section connected to the internal lower section and disposed over a third quadrant and a fourth quadrant of the second layer,
   wherein one end of the external upper section is supplied with an RF power, and the other end of the external lower section is grounded.

2. The antenna structure of claim 1, further comprising:
   an upper branch connecting the other end of the external upper section and one end of the internal upper section;
   a vertical branch connecting the other end of the internal upper section and one end of the internal lower section; and
   a lower branch connecting the other end of the internal lower section and one end of the external lower section.

* * * * *